(12) United States Patent
Suzuki et al.

(10) Patent No.: US 6,677,622 B2
(45) Date of Patent: Jan. 13, 2004

(54) SEMICONDUCTOR DEVICE HAVING INSULATED GATE BIPOLAR TRANSISTOR WITH DIELECTRIC ISOLATION STRUCTURE

(75) Inventors: Fumito Suzuki, Kawasaki (JP); Hitoshi Takahashi, Kawasaki (JP); Haruki Arai, Yokohama (JP); Yoshihiro Yamaguchi, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 10/090,823

(22) Filed: Mar. 6, 2002

(65) Prior Publication Data

US 2002/0125542 A1 Sep. 12, 2002

(30) Foreign Application Priority Data

Mar. 7, 2001 (JP) ........................................ 2001-063727

(51) Int. Cl.[7] .............................................. H01L 29/74
(52) U.S. Cl. ........................ 257/147; 257/152; 257/153
(58) Field of Search ................................ 257/339, 342, 257/119, 124, 133, 139, 147, 152, 153, 146, 141; 438/137, 138, 268

(56) References Cited

U.S. PATENT DOCUMENTS

| 5,485,023 | A | | 1/1996 | Sumida | |
| 5,644,150 | A | * | 7/1997 | Iwamuno | 257/147 |
| 5,869,850 | A | | 2/1999 | Endo et al. | |
| 5,930,630 | A | * | 7/1999 | Hshieh et al. | 438/268 |
| 6,451,645 | B1 | * | 9/2002 | Ozeki et al. | 438/237 |

* cited by examiner

Primary Examiner—Tuan H. Nguyen
(74) Attorney, Agent, or Firm—Oblon, Spivak, McClelland, Maier & Neustadt, P.C.

(57) ABSTRACT

A semiconductor substrate is of first-conductivity-type and has a principal surface. A first semiconductor region and a second semiconductor region are of second-conductivity-type and formed apart from each other in the principal surface of the semiconductor substrate. A third semiconductor region is of second-conductivity-type and formed on the first semiconductor region. The third semiconductor region has an impurity concentration higher than that of the first semiconductor region. A fourth semiconductor region is of first-conductivity-type and formed on the third semiconductor region. A first main electrode is formed on the fourth semiconductor region. A second main electrode is formed on the second semiconductor region. A gate electrode is formed, at least on the first semiconductor region and on the principal surface of the semiconductor substrate between the fourth semiconductor region and the second semiconductor region, with a gate insulating film therebetween.

7 Claims, 8 Drawing Sheets

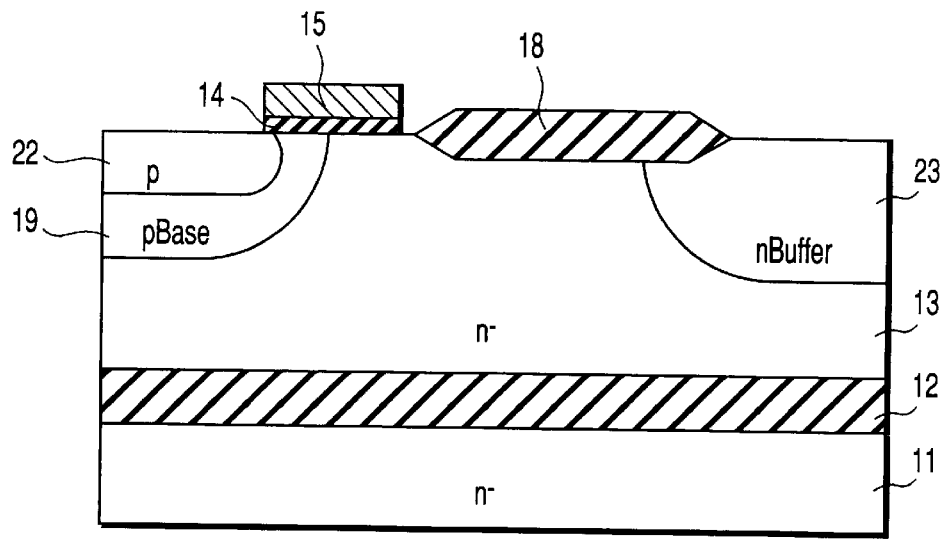
F I G. 9
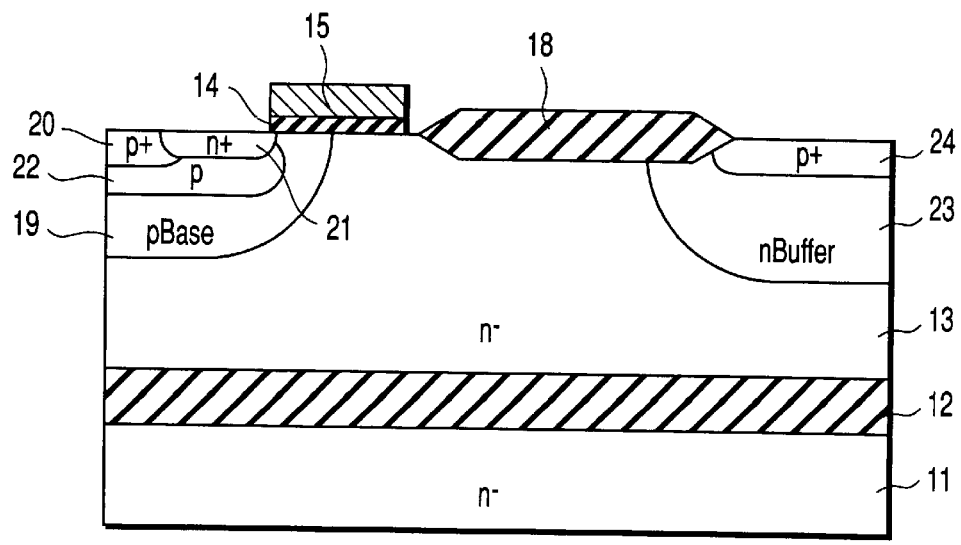
F I G. 10

SEMICONDUCTOR DEVICE HAVING INSULATED GATE BIPOLAR TRANSISTOR WITH DIELECTRIC ISOLATION STRUCTURE

CROSS-REFERENCE TO RELATED APPLICATION

This application is based upon and claims the benefit of priority from the prior Japanese Patent Application No. 2001-063727, filed Mar. 7, 2001, the entire contents of which are incorporated herein by reference.

BACKGROUND OF THE INVENTION

1. Field of the Invention

The present invention relates to a semiconductor device having an insulated gate bipolar transistor with a dielectric isolation structure and a method of manufacturing the same and, more particularly, to a semiconductor device used as a power IC, e.g., an IPD (Intelligent Power Device).

2. Description of the Related Art

Recently, many power semiconductor devices such as insulated gate bipolar transistors (to be referred to as IGBTs hereinafter) are used in purposes such as power conversion and power control of, e.g., inverters and converters. Hence, these power semiconductor devices are essential in the field of electric power.

A conventional lateral IGBT will be explained below with reference to FIGS. 1 and 2.

FIG. 1 is a cross-sectional view showing the structure of a lateral IGBT in a conventional dielectric isolated substrate. The above dielectric isolation structure isolates elements by a dielectric substance. As this dielectric isolation structure, an SOI (silicon on insulator) structure to be described below will be taken as an example.

As shown in FIG. 1, a silicon oxide film 102 is formed on an n⁻-type silicon layer 101. An n⁻-type silicon layer 103 is formed on this silicon oxide film 102. An SOI structure is formed by these n⁻-type silicon layer 101, silicon oxide film 102, and n⁻-type silicon layer 103.

On this n⁻-type silicon layer 103, a gate electrode 105 is formed with a gate insulating film 104 interposed between the n⁻-type silicon layer 103 and the gate electrode 105. In addition, on this n⁻-type silicon layer 103, an emitter electrode 106 and a collector electrode 107 are formed apart from the gate electrode 105. A field oxide film 108 is formed on the n⁻-type silicon layer 103 between the gate electrode 105 and the collector electrode 107. The gate electrode 105 is made of a polysilicon film about 4,000 Å thick.

A p-type base diffusion layer 109 is formed in the n⁻-type silicon layer 103 from a portion below the gate electrode 105 to a portion below the emitter electrode 106. A p⁺-type diffusion layer 110 is formed between this p-type base diffusion layer 109 and the emitter electrode 106. Furthermore, an n⁺-type diffusion layer 111 is formed on the p-type base diffusion layer 109.

An n-type buffer diffusion layer 112 is formed in the n⁻-type silicon layer 103 below the collector electrode 107. The main purpose of the n-type buffer diffusion layer 112 is to increase the collector-emitter withstand voltage. A p⁺-type diffusion layer 113 is formed between this n-type buffer diffusion layer 112 and the collector electrode 107. A lateral IGBT in the conventional dielectric isolation substrate is constructed as above.

In this IGBT having the structure shown in FIG. 1, however, a parasitic npn transistor composed of the n⁺-type diffusion layer 111, the p-type base diffusion layer 109, and the n⁻-type silicon layer 103 easily operates and sometimes destroys the IGBT by latch up. That is, when this parasitic npn transistor operates, the base current of a parasitic pnp transistor made up of the p⁺-type diffusion layer 113, the n-type buffer diffusion layer 112, the n⁻-type silicon layer 103, and the p-type base diffusion layer 109 increases. This amplifies the collector-emitter current of this parasitic pnp transistor. As a consequence, the collector-emitter current increases and destroys the IGBT. Especially when the impurity concentration in the p-type base diffusion layer 109 is low, the latch-up phenomenon causes more easily. To prevent this, the impurity concentration in the p-type base diffusion layer 109 can be increased. However, this makes it difficult to form an inversion layer in the channel region below the gate electrode 105.

To improve a capability of ruggedness by the latch-up phenomenon, therefore, in an IGBT as shown in FIG. 2, a p-type diffusion layer 114 is formed below a p-type base diffusion layer 109 on the side of an emitter electrode 106. This p-type diffusion layer 114 is formed by ion implantation before the formation of a gate electrode 105.

Unfortunately, in this IGBT shown in FIG. 2, if the p-type diffusion layer 114 diffuses to a prospective channel region below the gate electrode 105, the current-voltage characteristics such as the saturation voltage of a collector-emitter voltage Vce and a threshold voltage Vth are influenced. This increases variations in these current-voltage characteristics.

BRIEF SUMMARY OF THE INVENTION

A semiconductor device according to an aspect of the present invention comprises: a first-conductivity-type semiconductor substrate having a principal surface; a second-conductivity-type first semiconductor region and a second-conductivity-type second semiconductor region formed apart from each other in the principal surface of the semiconductor substrate; a second-conductivity-type third semiconductor region formed on the first semiconductor region, the third semiconductor region having an impurity concentration higher than that of the first semiconductor region; a first-conductivity-type fourth semiconductor region formed on the third semiconductor region; a first main electrode formed on the fourth semiconductor region; a second main electrode formed on the second semiconductor region; and a gate electrode formed, at least on the first semiconductor region and on the principal surface of the semiconductor substrate between the fourth semiconductor region and the second semiconductor region, with a gate insulating film interposed between the gate electrode and the first semiconductor region and the principal surface of the semiconductor substrate.

A manufacturing method of a semiconductor device according to an aspect of the present invention comprises: forming a second-conductivity-type first semiconductor region in the surface of a first-conductivity-type semiconductor substrate; forming a gate insulating film on the first semiconductor region and on the semiconductor substrate; forming a gate electrode on the gate insulating film; forming a second semiconductor region having an impurity concentration higher than that of the first semiconductor region in the first semiconductor region, by ion implantation using self-alignment which uses the gate electrode as a mask material; forming a first-conductivity-type third semiconductor region on the second semiconductor region, by ion implantation using self-alignment which uses the gate electrode as a mask material; and forming a secondconductivity-type fourth semiconductor region apart from the first semiconductor region, on the surface of the semiconductor substrate.

BRIEF DESCRIPTION OF THE SEVERAL VIEWS OF THE DRAWING

FIG. 9 is a cross-sectional view showing the fifth step of the method of manufacturing the IGBT of the first embodiment;

FIG. 10 is a cross-sectional view showing the sixth step of the method of manufacturing the IGBT of the first embodiment;

DETAILED DESCRIPTION OF THE INVENTION

Embodiments of the present invention will be described below with reference to the accompanying drawings.
First Embodiment FIG. 3 is a cross-sectional view showing the structure of a lateral IGBT in a dielectric isolated substrate according to the first embodiment of the present invention.

Figure 1:
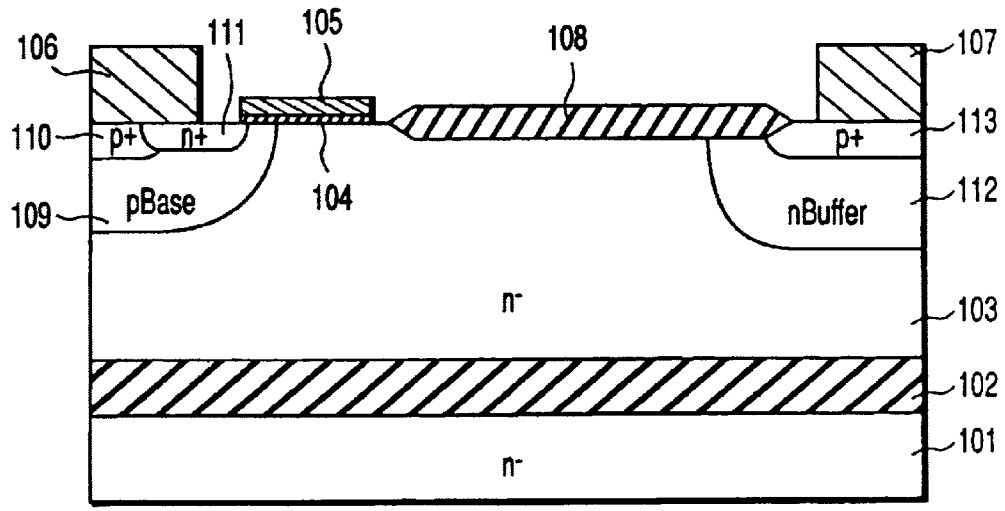
FIG. 1 is cross-sectional view showing the structure of a lateral IGBT in a conventional dielectric isolated substrate.
Figure 2:
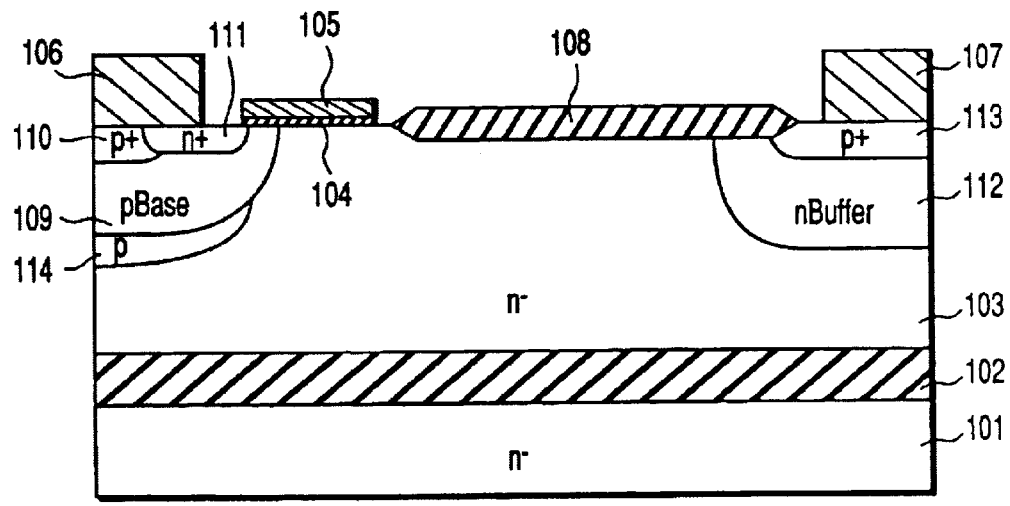
FIG. 2 is a cross-sectional view showing the structure of another lateral IGBT in a conventional dielectric isolated substrate.
Figure 3:
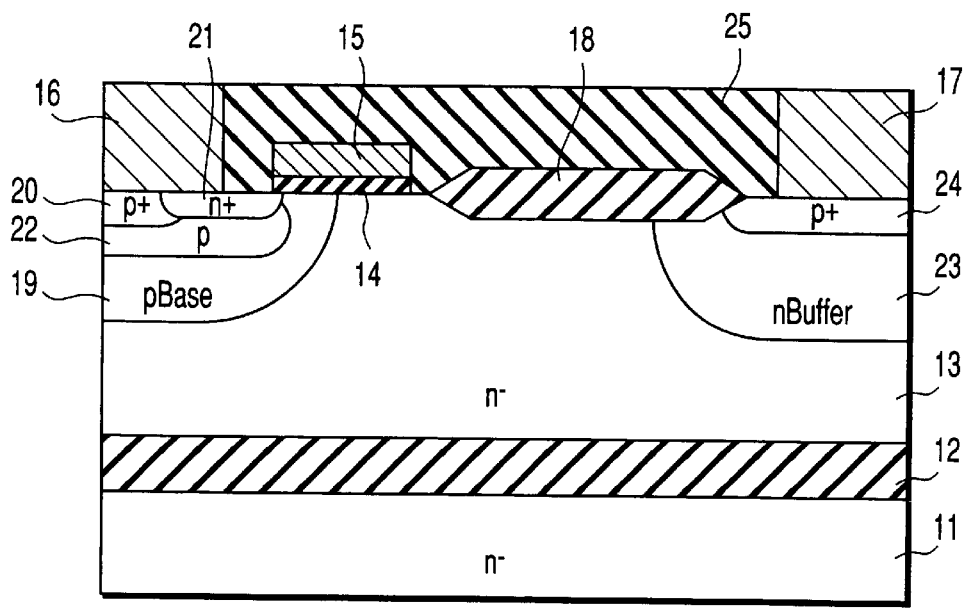
FIG. 3 is a cross-sectional view showing the structure of a lateral IGBT in a dielectric isolated substrate according to the first embodiment of the present invention.

As shown in FIG. 3, a silicon oxide film ($SiO_2$) 12 as a dielectric isolation film is formed on an n$^-$-type silicon semiconductor layer 11. An n$^-$-type silicon semiconductor layer 13 is formed on this silicon oxide film 12. An SOI (Silicon On Insulator) substrate is formed by these n$^-$-type silicon layer 11, silicon oxide film 12, and n$^-$-type silicon layer 13.

On this n$^-$-type silicon layer 13, a gate electrode 15 is formed with a gate insulating film 14 interposed between the n$^-$-type silicon layer 13 and the gate electrode 15. This gate insulating film 14 is a silicon oxide film. The gate electrode 15 is made of a polysilicon film and has a film thickness of about 5,000 Å or more. On the n$^-$-type silicon layer 13, an emitter electrode 16 and a collector electrode 17 are formed apart from the gate electrode 15. A field oxide film ($SiO_2$) 18 is formed on the n$^-$-type silicon layer 13 between the gate electrode 15 and the collector electrode 17.

As shown in FIG. 3, a p-type base diffusion layer 19 is formed in the n$^-$-type silicon layer 13 from a portion below the gate electrode 15 to a portion below the emitter electrode 16. Between this p-type base diffusion layer 19 and the emitter electrode 16, a p$^+$-type diffusion layer 20 is so formed as to contact the emitter electrode 16. In addition, between the p-type base diffusion layer 19 and the emitter electrode 16, an n$^+$-type diffusion layer 21 is so formed as to contact the emitter electrode 16. This n$^+$-type diffusion layer 21 is formed from a portion below the emitter electrode 16 to a portion below the gate electrode 15 and functions as a current path of this IGBT.

A p-type diffusion layer 22 is formed between the p-type base diffusion layer 19 and the p$^+$- and n$^+$-type diffusion layers 20 and 21. The p+-type diffusion layer 20 is in contact with the p-type diffusion layer 22, and the p-type diffusion layer 22 is in contact with the p-type base diffusion layer 19. The p$^+$-type diffusion layer 20 is a contact layer having a function of stabilizing the potentials of the p-type diffusion layer 22 and the p-type base layer 19 at the same potential as the emitter electrode 16.

This p-type diffusion layer 22 is formed by self-aligned ion implantation using the gate electrode 15 as a mask. In this ion implantation, boron (B), for example, is doped at an acceleration voltage of 100 keV or more and a dose of about $1.0 \times 10^{13}$ to about $1.0 \times 10^{14}$ cm$^{-2}$. Note that in the ion implantation of the p-type base diffusion layer 19, boron (B), for example, is doped at an acceleration voltage of 30 to 100 keV or more and a dose of about $1.0 \times 10^{13}$ to about $1.0 \times 10^{15}$ cm$^{-2}$. This p-type base diffusion layer 19 is formed by performing annealing a plurality of times after the ion implantation. The p-type diffusion layer 22 is formed by performing annealing a smaller number of times than that for the p-type base diffusion layer 19, after the ion implantation is performed. Therefore, as shown in FIG. 3, the p-type base diffusion layer 19 is larger than the p-type diffusion layer 22 and has an impurity concentration lower than that of the p-type diffusion layer 22.

An n-type buffer diffusion layer 23 is formed in the n$^-$-type silicon layer 13 below the collector electrode 17. A p$^+$-type diffusion layer 24 is formed between this n-type buffer diffusion layer 23 and the collector electrode 17. Furthermore, a dielectric interlayer 25 is formed on the n$^-$-type silicon layer 13 including the gate electrode 15 and the field oxide film 18. The lateral IGBT of the first embodiment is constructed as above.

In the IGBT having this structure, the p-type diffusion layer 22 covers the lower portions of the n$^+$-type diffusion layer 21 and the p$^+$-type diffusion layer 20 without diffusing to a channel region below the gate electrode 15. This channel region means a surface region of the p-type base diffusion layer 19 in contact with the gate insulating film 14 below the gate electrode 15. This can decrease the resistivity (increase the impurity concentration) in the region (p-type diffusion layer 22) below the n$^+$-type diffusion layer 21. This makes the parasitic npn transistor described above difficult to operate, and also makes a parasitic pnp transistor difficult to operate. Furthermore, latch up occurring when these parasitic npn and pnp transistors operate can be prevented.

Consequently, a large ON current flowing upon latch up can also be suppressed, so it is possible to protect this IGBT from being destroyed by such a large electric current. Accordingly, we can improve a capability of ruggedness by the latch-up phenomenon.

Figure 4:
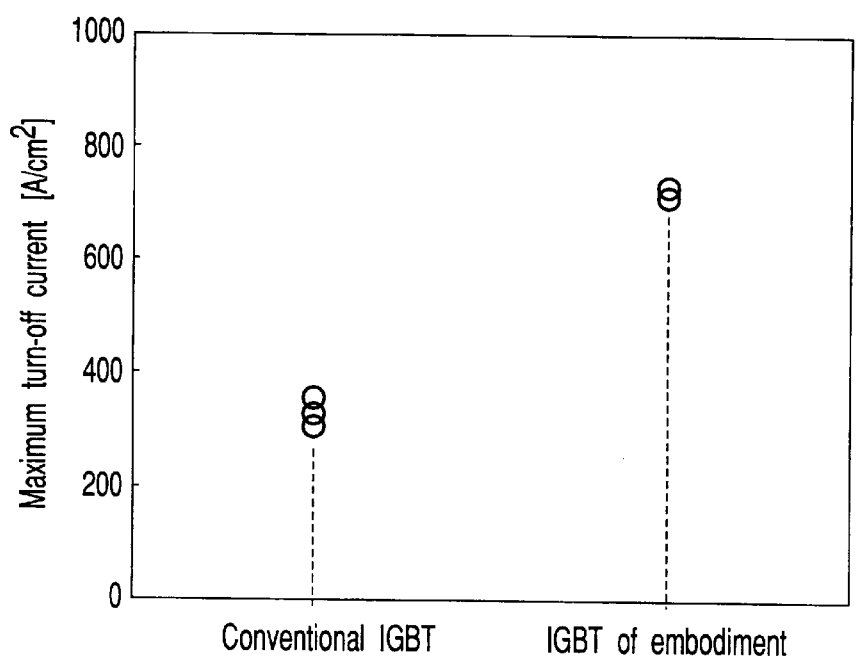
FIG. 4 is a graph showing the maximum turn-off current of the IGBT of the first embodiment and that of a conventional IGBT.

FIG. 4 shows the maximum turn-off current of a conventional IGBT having no p-type diffusion layer 22 and that of the IGBT of this embodiment. The turn-off current is one index which indicates the current ruggedness of an IGBT. As shown in FIG. 4, the maximum turn-off current of the IGBT of this embodiment is twice that of the conventional IGBT or more. This indicates that the electric current performance of the IGBT of this embodiment is twice that of the conventional IGBT or more.

Next, a method of manufacturing the lateral IGBT of the first embodiment by using an SOI wafer will be explained.

FIGS. 5 to 10 are cross-sectional views showing the steps of the method of manufacturing the IGBT of the first embodiment.

Figure 5:
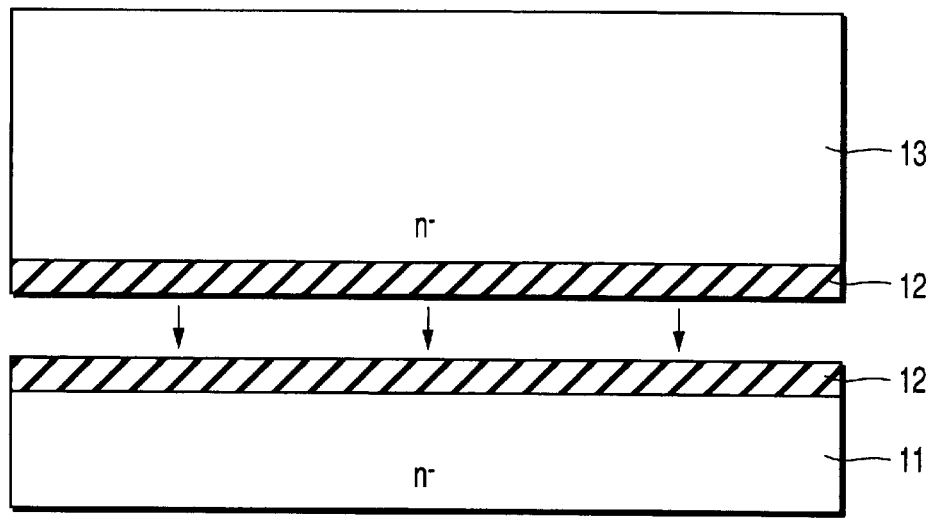
FIG. 5 is a cross-sectional view showing the first step of a method of manufacturing the IGBT of the first embodiment.

As shown in FIG. 5, a silicon oxide film 12 is formed on an n$^-$-type silicon semiconductor substrate 11. Another silicon oxide film 12 is formed on an n$^-$-type silicon semiconductor substrate 13. Subsequently, the silicon oxide films 12 of the two silicon substrates 11 and 13 are adhered by bonding, thereby forming an SOI substrate as shown in FIG. 6.

Figure 6:
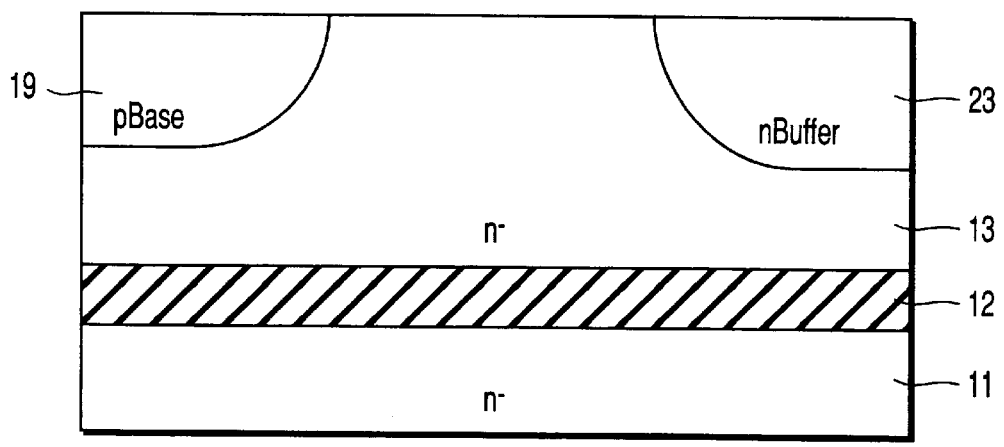
FIG. 6 is a cross-sectional view showing the second step of the method of manufacturing the IGBT of the first embodiment.

In addition, as shown in FIG. 6, in the upper layer of the ne-type silicon substrate 13, a p-type base diffusion layer 19 and an n-type buffer diffusion layer 23 are formed apart from each other by ion implantation. In this ion implantation of the p-type base diffusion layer 19, boron (B), for example, is doped at an acceleration voltage of 30 to 100 keV or more and a dose of about $1.0 \times 10^{13}$ to about $1.0 \times 10^{14}$ cm$^{-2}$. Both the p-type base diffusion layer 19 and the n-type buffer diffusion layer 23 are annealed after the doping of impurity ions, thereby forming regions of predetermined sizes. The depth of the p-type base diffusion layer 19 from the surface of the n$^-$-type silicon substrate 13 is 1.5 to 4.0 μm.

Figure 7:
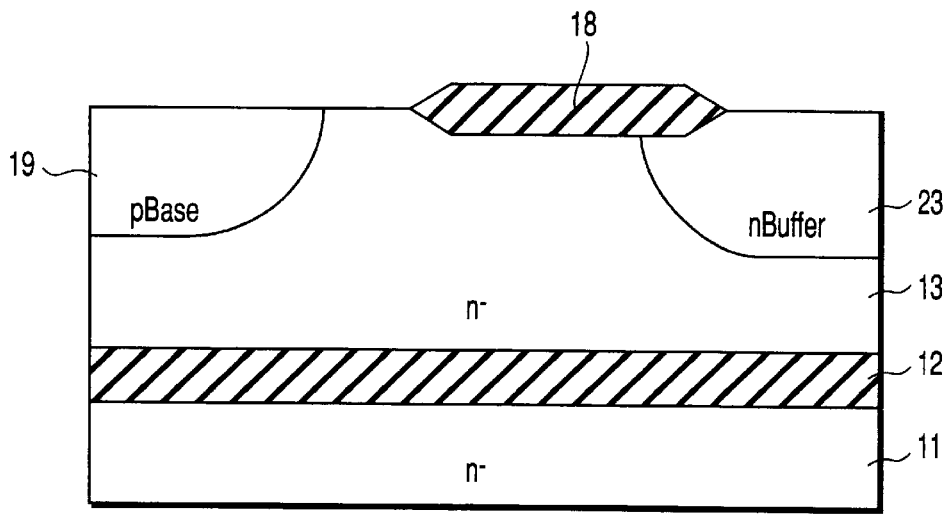
FIG. 7 is a cross-sectional view showing the third step of the method of manufacturing the IGBT of the first embodiment.

After that, as shown in FIG. 7, a field oxide film (SiO$_2$) 18 is formed by LOCOS on the n$^-$-type silicon substrate 13 between the p-type base diffusion layer 19 and the n-type buffer diffusion layer 23. This field oxide film 18 is spaced a predetermined distance from the p-type base diffusion layer 19, and partially overlaps the n-type buffer diffusion layer 23.

Figure 8:
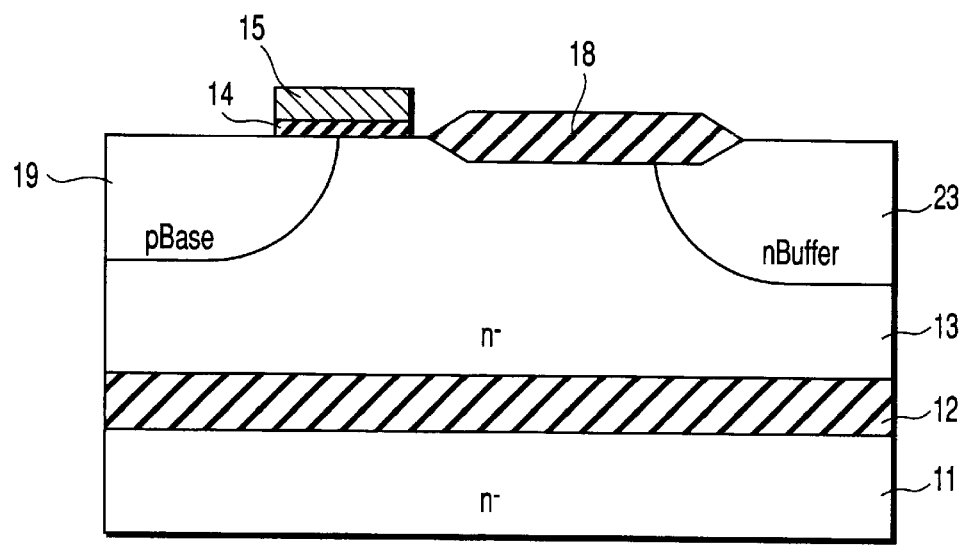
FIG. 8 is a cross-sectional view showing the fourth step of the method of manufacturing the IGBT of the first embodiment.

Next, as shown in FIG. 8, a silicon oxide film (gate insulating film) 14 is formed by thermal oxidation on the p-type base diffusion layer 19 and the n$^-$-type silicon substrate 13. In addition, conductive polysilicon is deposited on the gate insulating film 14 to form a conductive polysilicon film. This conductive polysilicon film is then patterned to form a gate electrode 15. The film thickness of this gate electrode 15 is 5,000 Å or more.

As shown in FIG. 9, ion implantation is performed by self-alignment using the gate electrode 15 as a mask material in the upper layer of the p-type base diffusion layer 19, forming a p-type diffusion layer 22. In this ion implantation, boron (B), for example, is doped at an acceleration voltage of 100 keV or more and a dose of about $1.0 \times 10^{13}$ to $1.0 \times 10^{15}$ cm$^{-2}$. The impurity concentration in the p-type diffusion layer 22 is higher than that in the p-type base diffusion layer 19.

After that, as shown in FIG. 10, a p$^+$-type diffusion layer 20 is formed in the upper layer of the p-type diffusion layer 22 by ion implantation. This ion implantation for forming the p$^+$-type diffusion layer 20 is executed after a region except for the p$^+$-type diffusion layer 20 is protected with a mask material. Furthermore, in the upper layer of this p-type diffusion layer 22, an n$^+$-type diffusion layer 21 is formed by covering the p$^+$-type diffusion layer 20 with a mask material and performing ion implantation by self-alignment using the gate electrode 15 as another mask material.

Also, a p$^+$-type diffusion layer 24 is formed on the n-type buffer diffusion layer 23 by the same formation step as for the p$^+$-type diffusion layer 20.

All of the p-type diffusion layer 22, the p$^+$-type diffusion layers 20 and 24, and the n$^+$-type diffusion layer 21 are annealed after the doping of impurity ions, thereby forming regions of predetermined sizes. The depth of the p-type diffusion layer 22 from the surface of the n$^-$-type silicon substrate 13 is less than that of the p-type base diffusion layer 19 from the surface of the ne-type silicon substrate 13. When the depth of the p-type base diffusion layer 19 is 1.5 μm, the depth of the p-type diffusion layer 22 is 1.0 to 1.2 μm. The depth of the p$^+$-type diffusion layer 20 from the surface of the n$^-$-type silicon substrate 13 is less than 0.5 μm.

On the structure shown in FIG. 3, a dielectric interlayer 25 is formed by CVD. Subsequently, contact holes are formed by etching system (for example RIE) in the dielectric interlayer 25 on the p$^+$-type diffusion layer 20, the n$^+$-type diffusion layer 21, and the p$^+$-type diffusion layer 24. A metal such as aluminum (Al) is buried in these contact holes. Unnecessary Al is removed by etching system (for example RIE) to form an emitter electrode 16 and a collector electrode 17 as shown in FIG. 3. Through the above steps, the lateral IGBT in the dielectric isolation substrate of the first embodiment is completed.

In the manufacturing method described above, to prevent the diffusion of the p-type diffusion layer 22 to the prospective channel region below the gate electrode 15, a p-type impurity is doped by self-alignment using the gate electrode 15 as a mask material after the formation of the gate electrode 15, thereby forming the p-type diffusion layer 22. That is, the gate electrode 15 serves as a film for stopping the implantation of the p-type impurity when this p-type impurity is ion-implanted, thereby preventing the implantation of the p-type impurity into the channel region. Note that the impurity doping for forming the p-type diffusion layer 22 is performed after the formation of the gate electrode 15, i.e., after the thermal diffusion of the p-type base diffusion layer 19 and the n-type buffer diffusion layer 23. Hence, to form the p-type diffusion layer 22 below the n$^+$-type diffusion layer 21, ion implantation must be performed using a high acceleration voltage of 100 keV or more.

By this manufacturing method, the lower portion of the n$^+$-type diffusion layer 21 can be covered with the p-type diffusion layer 22 without diffusing this p-type diffusion layer 22 to the channel region below the gate electrode 15. Accordingly, it is possible to decrease the resistivity (increase the impurity concentration) in the region below the n$^+$-type diffusion layer 21. This makes it possible to reduce the influence of latch up produced by the combined effect of the parasitic npn and pnp transistors described earlier, and to improve a capability of ruggedness by the latch up phenomenon.

In addition, as described previously, the p-type diffusion layer 22 is formed by self-alignment using the gate electrode 15 as a mask material. This can eliminate a positional deviation of the p-type diffusion layer 22 from the gate electrode 15. Consequently, current-voltage characteristics having little variations can be obtained in the IGBT.

Also, the film thickness of polysilicon for forming the gate electrode 15 is 5,000 Å or more. Accordingly, when ion implantation for forming the p-type diffusion layer 22 is performed, no impurity ions punch through the gate electrode 15 to reach the p-type base diffusion layer 19.

Figure 11A:
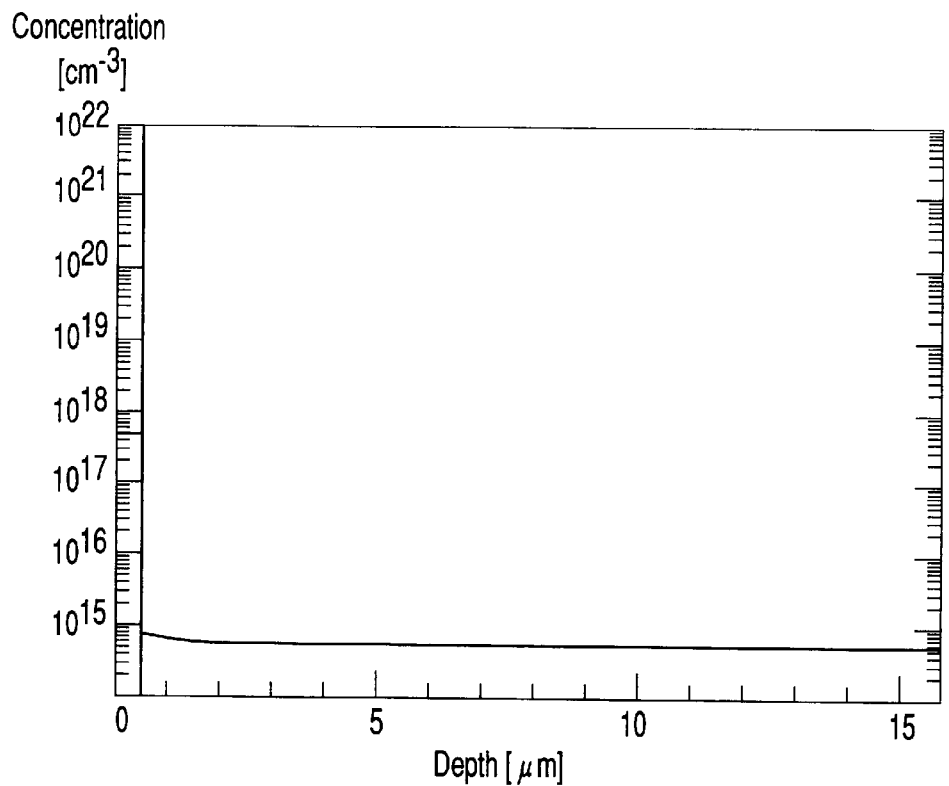
FIG. 11A is a graph showing the diffusion profile of an impurity when the film thickness of a gate electrode is 5,000 Å or more.
Figure 11B:
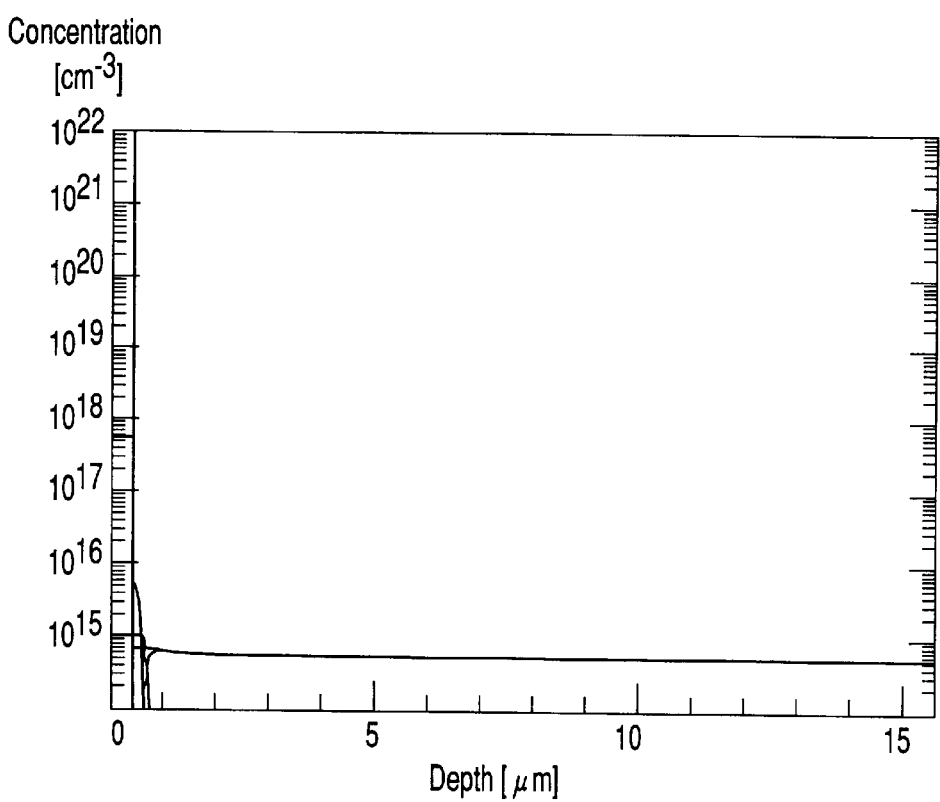
FIG. 11B is a graph showing the diffusion profile of an impurity when the film thickness of a gate electrode is less than 5,000 Å.

FIG. 11A is a graph showing an impurity diffusion profile when the film thickness of the gate electrode 15 is 5,000 Å or more. FIG. 11B is a graph showing an impurity diffusion profile when the film thickness of the gate electrode 15 is less than 5,000 Å. FIGS. 11A and 11B demonstrate that if the film thickness of the gate electrode 15 is less than 5,000 Å, p-type impurity ions punch through the gate electrode 15 to reach the channel region (p-type diffusion layer 22) below the gate electrode 15.

Figure 12:
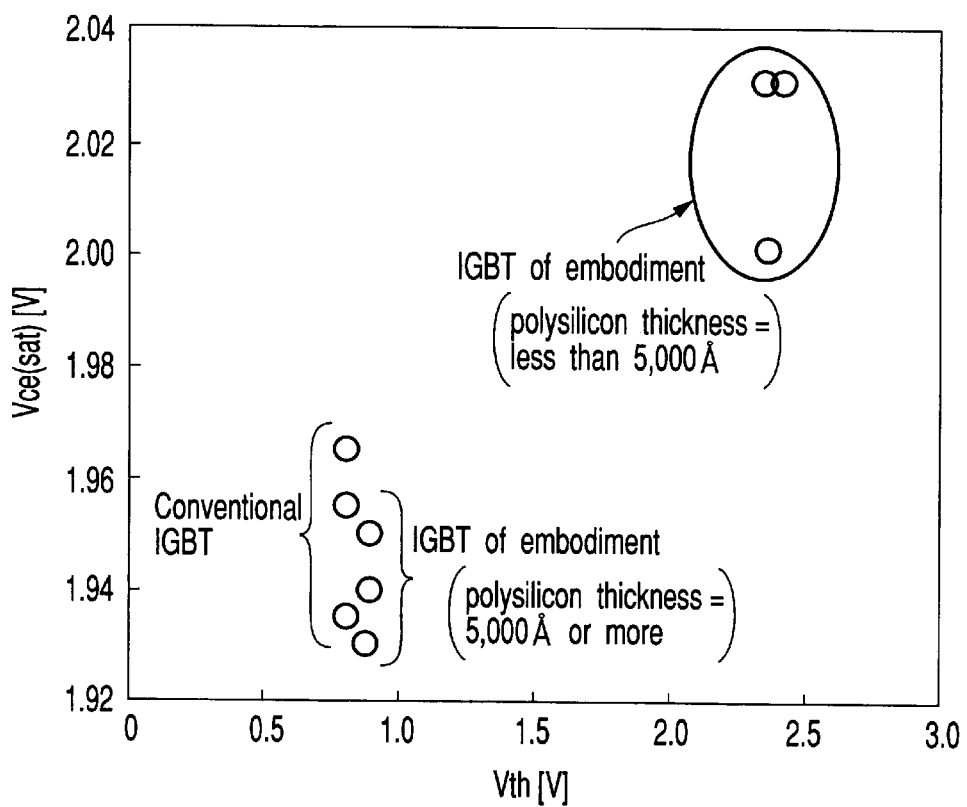
FIG. 12 is a graph showing the current-voltage characteristics of the IGBT of the first embodiment and those of a conventional IGBT.

FIG. 12 is a graph showing the current-voltage characteristics of the IGBT of the first embodiment. FIG. 12 also shows the current-voltage characteristics of a conventional IGBT.

FIG. 12 shows that when the film thickness of the gate electrode 15 is 5,000 Å or more, a collector-emitter voltage Vce and a threshold voltage Vth are almost the same as those of the conventional IGBT. However, if the film thickness of the gate electrode 15 is less than 5,000 Å, both the collector-emitter voltage Vce and the threshold voltage Vth are higher than those of the conventional IGBT. The foregoing reveal that when the film thickness of the gate electrode 15 is 5,000 Å or more, no p-type impurity ions punch through the gate electrode 15; if the film thickness of the gate electrode 15 is less than 5,000 Å, p-type impurity ions punch through the gate electrode 15 to reach the channel region below this gate electrode 15.

Second Embodiment

A power IC to which the IGBT of the above first embodiment is applied will be described below as the second embodiment.

Figure 13:
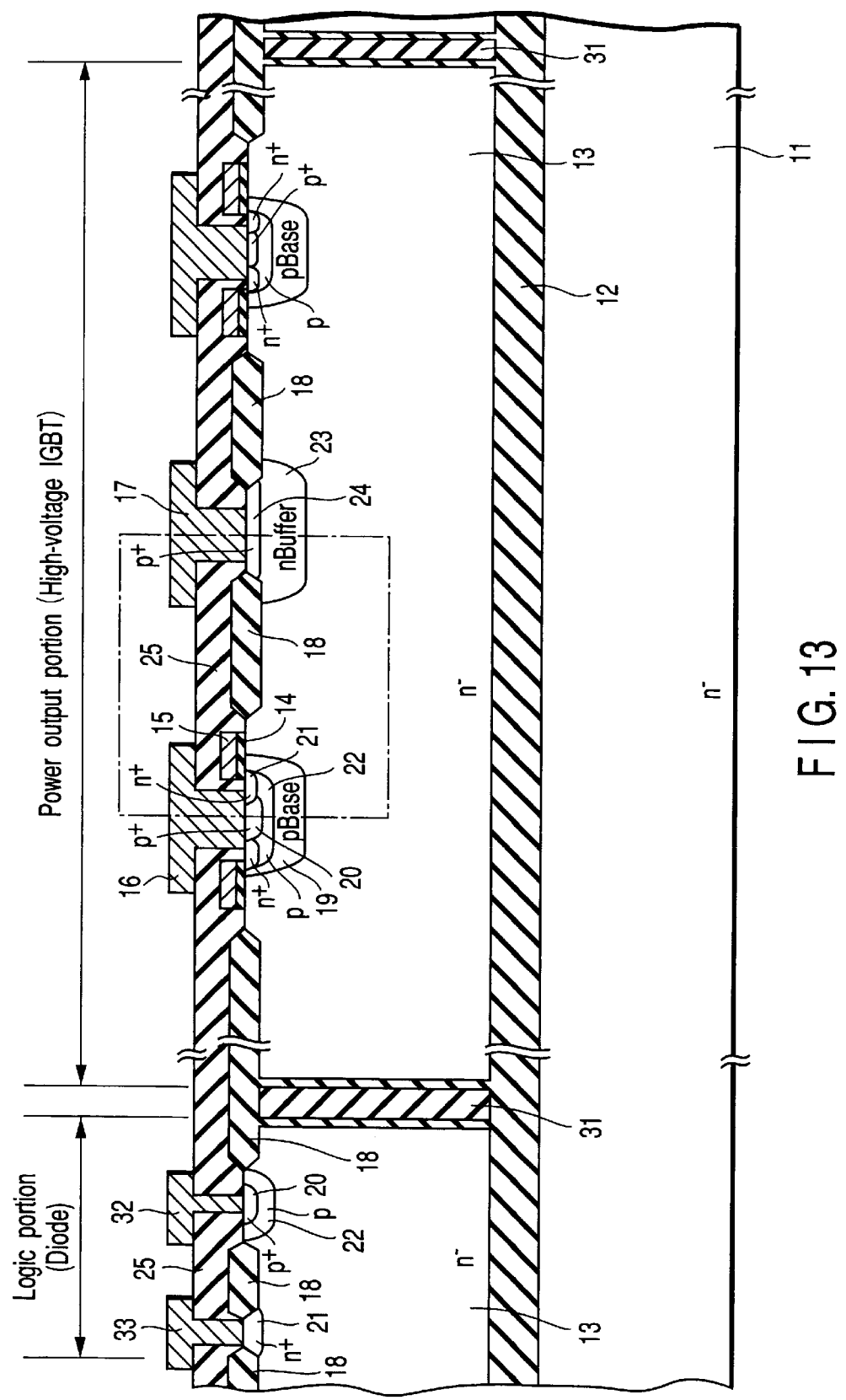
FIG. 13 is a cross-sectional view showing the structure of a power IC having an IGBT according to the second embodiment of the present invention.

FIG. 13 is a cross-sectional view showing the structure of this power IC having the IGBT structure, according to the second embodiment of the present invention.

As shown in FIG. 13, the IGBT of the first embodiment is formed in a region (power output portion) isolated by a polysilicon film 31 as a trench isolation film. The alternate long and short dashed lines in FIG. 13 correspond to a unit cell of the IGBT explained in the first embodiment.

Also, a diode is formed in another region (logic portion) isolated by the polysilicon film 31 as a trench isolation film.

A method of manufacturing the diode will be described below.

On an n⁻type silicon substrate 13, a field oxide film 18 is formed by the same step as the formation step of the field oxide film 18 of the IGBT. This field oxide film 18 is so formed that prospective anode and cathode regions of the Zener diode are open.

Next, in the prospective anode region surrounded by the field oxide film 18, a p-type diffusion layer 22 is formed by the same step as the formation step of the p-type diffusion layer 22 of the IGBT. In addition, a p⁺-type diffusion layer 20 is formed on this p-type diffusion layer 22 by the same step as the formation step of the p⁺-type diffusion layers 20 and 24 of the IGBT.

Subsequently, in the prospective cathode region surrounded by the field oxide film 18, an n⁺-type diffusion layer 21 is formed by the same step as the formation step of the n⁺-type diffusion layer 21 of the IGBT.

After that, a dielectric interlayer 25 is formed on the above structure by the same step as the formation step of the dielectric interlayer 25 of the IGBT. In addition, in this dielectric interlayer 25 on the p⁺-type diffusion layer 20 and the n⁺-type diffusion layer 21, contact holes are formed by the same step as the formation step of the contact holes of the IGBT. A metal such as aluminum (Al) is buried in these contact holes by the same step as for the IGBT. Furthermore, unnecessary Al is removed by the same step (etching system (for example RIE) as for the IGBT, thereby forming an anode electrode 32 and a cathode electrode 33. Through the above steps, a Zener diode having a dielectric isolation structure is completed.

In this power IC fabrication method, the p-type diffusion layer 22 of the IGBT in the power output portion can be formed by using the formation step of the p-type diffusion layer 22 necessary in the logic portion. This fabrication method is advantageous because the number of manufacturing steps does not increase.

The above-mentioned embodiments can be practiced singly or in the form of an appropriate combination. Also, each of the above embodiments includes inventions in various stages. So, these inventions in various stages can be extracted by properly combining a plurality of components disclosed in each embodiment.

As described above, each embodiment of the present invention can provide a semiconductor device having a lateral IGBT capable of improving ruggedness by the latch-up phenomenon and reducing variations in the current-voltage characteristics, and to provide a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:

a first-conductivity-type semiconductor substrate having a principal surface;

a second-conductivity-type first semiconductor region and a second-conductivity-type second semiconductor region formed apart from each other in the principal surface of said semiconductor substrate;

a second-conductivity-type third semiconductor region formed on said first semiconductor region, said third semiconductor region having an impurity concentration higher than that of said first semiconductor region;

a first-conductivity-type fourth semiconductor region formed on said third semiconductor region;

a first main electrode formed on said fourth semiconductor region;

a second main electrode formed on said second semiconductor region; and a gate electrode formed, at least on said first semiconductor region and on the principal surface of said semiconductor substrate between said fourth semiconductor region and said second semiconductor region, with a gate insulating film interposed between said gate electrode and said first semiconductor region and the principal surface of said semiconductor substrate, wherein the third semiconductor region is self-aligned with the gate electrode.

2. A semiconductor device according to claim 1, further comprising a fifth semiconductor region formed between said third semiconductor region and said first main electrode, said fifth semiconductor region having an impurity concentration higher than that of said third semiconductor region.

3. A semiconductor device according to claim 1, wherein said third semiconductor region is formed by ion implantation using self-alignment which uses said gate electrode as a mask material, and said third semiconductor region does not reach a channel region formed on the surface of said first semiconductor region below said gate electrode.

4. A semiconductor device according to claim 1, further comprising a field insulating film formed on said semiconductor substrate between said gate electrode and said second semiconductor region.

5. A semiconductor device according to claim 1, wherein said semiconductor substrate is an island region formed on a dielectric isolation layer.

6. A semiconductor device according to claim 1, wherein said gate electrode is made of a polysilicon film having a film thickness of not less than 5,000 Å.

7. A semiconductor device according to claim 1, wherein said semiconductor device is an insulated gate bipolar transistor having said first semiconductor region as a base, said third semiconductor region as an emitter, and said second semiconductor region as a collector.

* * * * *